US009728642B2

(12) United States Patent
Doris et al.

(10) Patent No.: US 9,728,642 B2
(45) Date of Patent: Aug. 8, 2017

(54) RETAINING STRAIN IN FINFET DEVICES

(71) Applicant: International Business Machines Corporation, Armonk, NY (US)

(72) Inventors: Bruce B. Doris, Slingerlands, NY (US); Gauri Karve, Cohoes, NY (US); Fee Li Lie, Albany, NY (US); Junli Wang, Singerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/932,112

(22) Filed: Nov. 4, 2015

(65) Prior Publication Data

US 2017/0125577 A1 May 4, 2017

(51) Int. Cl.
*H01L 29/78* (2006.01)
*H01L 29/66* (2006.01)
(Continued)

(52) U.S. Cl.
CPC .......... *H01L 29/785* (2013.01); *H01L 21/308* (2013.01); *H01L 29/1054* (2013.01);
(Continued)

(58) Field of Classification Search
CPC . H01L 29/785; H01L 21/308; H01L 29/1054; H01L 29/1604; H01L 29/161;
(Continued)

(56) References Cited

U.S. PATENT DOCUMENTS 6,696,348 B1 2/2004 Xiang
6,897,122 B1 5/2005 Xiang
(Continued)

FOREIGN PATENT DOCUMENTS

CN 102790005 A 11/2012
CN 102790005 B 4/2014

OTHER PUBLICATIONS

Bruce B. Doris, et al., Pending U.S. Appl. No. 15/344,888 entitled "Retaining Strain in FinFET Devices," filed Nov. 7, 2016.
(Continued)

*Primary Examiner* — Yasser A Abdelaziez
(74) *Attorney, Agent, or Firm* — Cantor Colburn LLP; Vazken Alexanian

(57) ABSTRACT

A method for fabricating a semiconductor device comprises patterning a strained fin from a strained layer of semiconductor material arranged on a substrate, depositing a first layer of semiconductor material on the fin and exposed portions of the substrate, patterning and etching to remove a portion of the first layer of semiconductor material and a portion of the fin to expose a portion of the substrate, depositing a second layer of semiconductor material on exposed portions of the substrate and the first layer of semiconductor material, and patterning and etching to remove a portion of the second layer of semiconductor material layer and the first layer of semiconductor material to define a dummy gate stack, the dummy gate stack is operative to substantially maintain the strain in the strained fin.

1 Claim, 26 Drawing Sheets

(51) Int. Cl.
    *H01L 29/10* (2006.01)
    *H01L 21/308* (2006.01)
    *H01L 29/16* (2006.01)
    *H01L 29/161* (2006.01)

(52) U.S. Cl.
    CPC ........ *H01L 29/161* (2013.01); *H01L 29/1604* (2013.01); *H01L 29/6656* (2013.01); *H01L 29/66545* (2013.01); *H01L 29/66795* (2013.01)

(58) Field of Classification Search
    CPC ........... H01L 29/66545; H01L 29/6656; H01L 29/66795
    USPC ......................................................... 257/401
    See application file for complete search history.

(56) References Cited

U.S. PATENT DOCUMENTS

| | | | |
|---|---|---|---|
| 6,989,058 B2 | 1/2006 | Bedell et al. | |
| 8,211,775 B1* | 7/2012 | Ma | H01L 29/4983 257/E21.444 |
| 8,652,892 B2 | 2/2014 | Liu et al. | |
| 8,658,536 B1 | 2/2014 | Choi et al. | |
| 8,878,309 B1* | 11/2014 | Hong | H01L 27/0886 257/330 |
| 8,916,933 B2 | 12/2014 | Cheng et al. | |
| 2013/0187237 A1* | 7/2013 | Yu | H01L 21/823807 257/369 |
| 2014/0061801 A1* | 3/2014 | Doornbos | H01L 21/823807 257/351 |
| 2015/0041924 A1* | 2/2015 | Moroz | G06F 17/5072 257/401 |
| 2015/0097270 A1 | 4/2015 | Bedell et al. | |
| 2015/0144962 A1 | 5/2015 | Rim et al. | |
| 2015/0325686 A1* | 11/2015 | Allibert | H01L 29/66795 438/199 |
| 2016/0056162 A1* | 2/2016 | Yeh | H01L 29/78 257/379 |

OTHER PUBLICATIONS

List of IBM Patents or Patent Applications Treated as Related; (Appendix P), Date Filed Nov. 9, 2016; 2 pages.

* cited by examiner

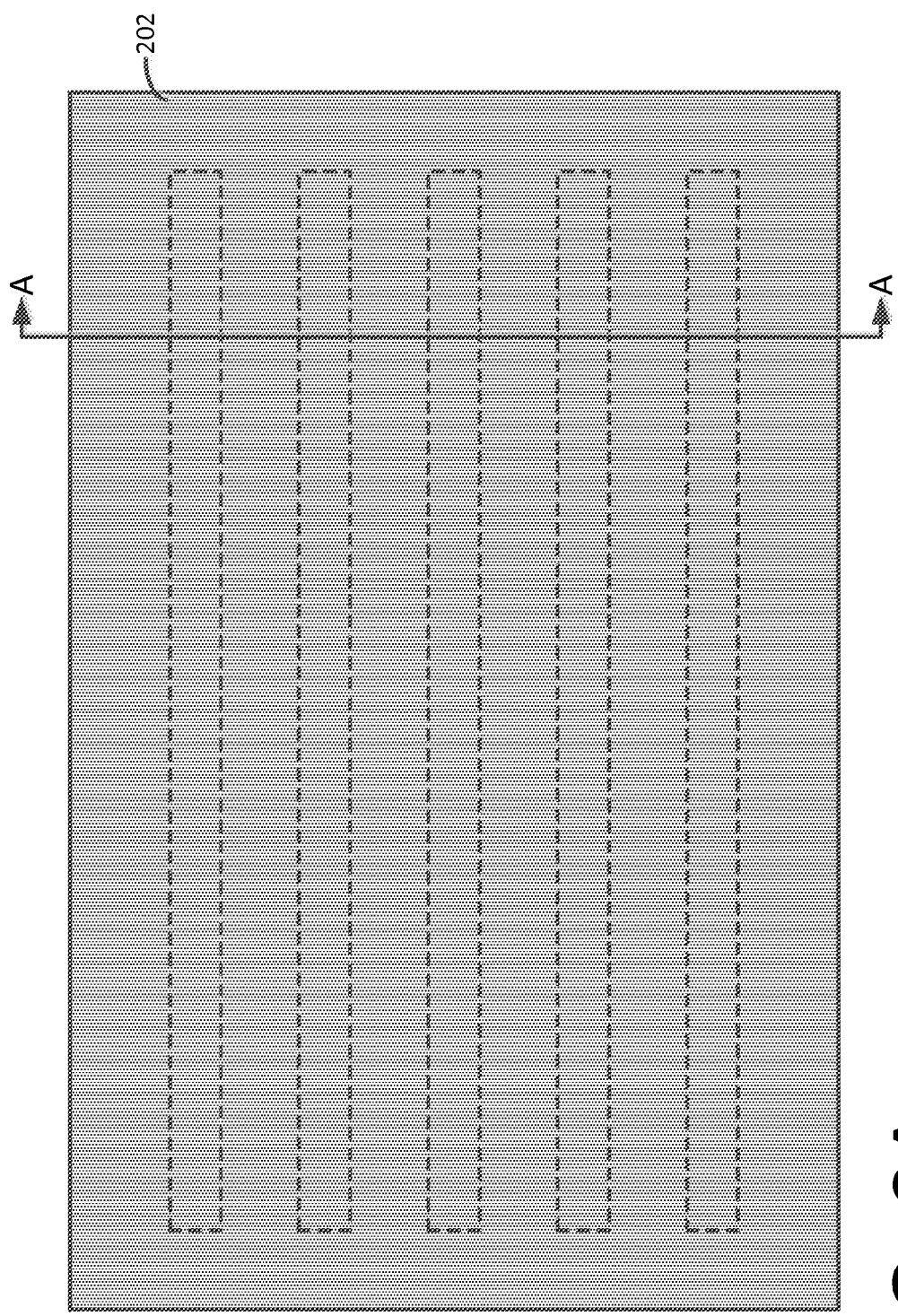

RETAINING STRAIN IN FINFET DEVICES

BACKGROUND

The present invention relates to semiconductor devices, and more specifically, to FINfet devices.

Field effect transistors (FETs) are widely used in the electronics industry for switching, amplification, filtering, and other tasks related to both analog and digital electrical signals. Most common among these are metal-oxide-semiconductor field-effect transistors (MOSFET), in which a gate structure is energized to create an electric field in an underlying channel region of a semiconductor body, by which electrons are allowed to travel through the channel between a source region and a drain region of the semiconductor body. Complementary metal-oxide-semiconductor field-effect transistor, which are typically referred to as CMOS devices, have become widely used in the semiconductor industry. These CMOS devices include both n-type and p-type (NMOS and PMOS) transistors, and therefore promote the fabrication of logic and various other integrated circuitry.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques. Three-dimensional semiconductor devices, such as fin-type semiconductor devices (referred to as finFETs), typically include dielectric gate spacers formed on sidewalls of the gate stack to isolate the gate stack from the adjacent source/drain (S/D) regions.

It is often desirable to induce strain in the channel regions of FET devices. The strain may be induced by epitaxially growing silicon material and silicon germanium material such that the crystalline lattice structure of the materials is mismatched and induces a strain on one of the layers of semiconductor material. The sufficient channel strain improves the performance of the devices.

SUMMARY

According to an exemplary embodiment of the invention, a method for fabricating a semiconductor device comprises patterning a strained fin from a strained layer of semiconductor material arranged on a substrate, depositing a first layer of semiconductor material on the fin and exposed portions of the substrate, patterning and etching to remove a portion of the first layer of semiconductor material and a portion of the fin to expose a portion of the substrate, depositing a second layer of semiconductor material on exposed portions of the substrate and the first layer of semiconductor material, and patterning and etching to remove a portion of the second layer of semiconductor material layer and the first layer of semiconductor material to define a dummy gate stack, the dummy gate stack is operative to substantially maintain the strain in the strained fin.

According to another exemplary embodiment of the invention, a method for fabricating a semiconductor device comprises patterning a strained fin from a strained layer of semiconductor material arranged on a substrate, depositing a first layer of semiconductor material on the fin and exposed portions of the substrate, depositing a layer of hardmask material on the first layer of semiconductor material, patterning and etching to remove a portion of the first layer of semiconductor material, a portion of the layer of hardmask material, and a portion of the fin to expose a portion of the substrate, depositing a second layer of semiconductor material on exposed portions of the substrate and the first layer of semiconductor material, and patterning and etching to remove a portion of the second layer of semiconductor material layer and the first layer of semiconductor material to define a dummy gate stack, the dummy gate stack is operative to substantially maintain the strain in the strained fin.

According to yet another exemplary embodiment of the invention, a semiconductor device comprises a first strained semiconductor fin on a substrate, a second strained semiconductor fin on the substrate, the second strained semiconductor fin having a longitudinal axis that is substantially collinear with a longitudinal axis of the first strained semiconductor fin, a first gate stack arranged over the first strained semiconductor fin, wherein the first gate stack is operative to substantially maintain the strain in the first semiconductor fin, and a second gate stack arranged over the second strained semiconductor fin, wherein the second gate stack is operative to substantially maintain the strain in the second semiconductor fin.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2A illustrates a top view following the deposition of a silicon layer over the fins and the substrate.

FIGS. 14-17B illustrate an alternate exemplary method of fabricating a strained finFET device, in the regard:

FIG. 14 is the same as FIG. 2A discussed above and includes a silicon layer arranged over the substrate and fins.

FIG. 17B illustrates a cut away view along the line A-A of FIG. 17A.

DETAILED DESCRIPTION

The embodiments described herein provide for a finFET device that has sufficient channel strain to improve the performance of the finFET device. In fabrication, fins are often formed by patterning and etching a semiconductor substrate material to define fins. When the semiconductor substrate material is strained, the resultant fins are also strained.

During fabrication, the fins are often "cut" by etching to remove fin material to form shorter fins from a longer fin. The etching of the fins to cut the fins often undesirably reduces the strain in the fins. The strain is particularly reduced near the ends of the fins where the cuts are performed. The methods and resultant structures described below provide for fins having strained channel regions that remain strained following the cutting of the fins to reduce the length of the fins and form a number of fins from a single fin.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 1A:
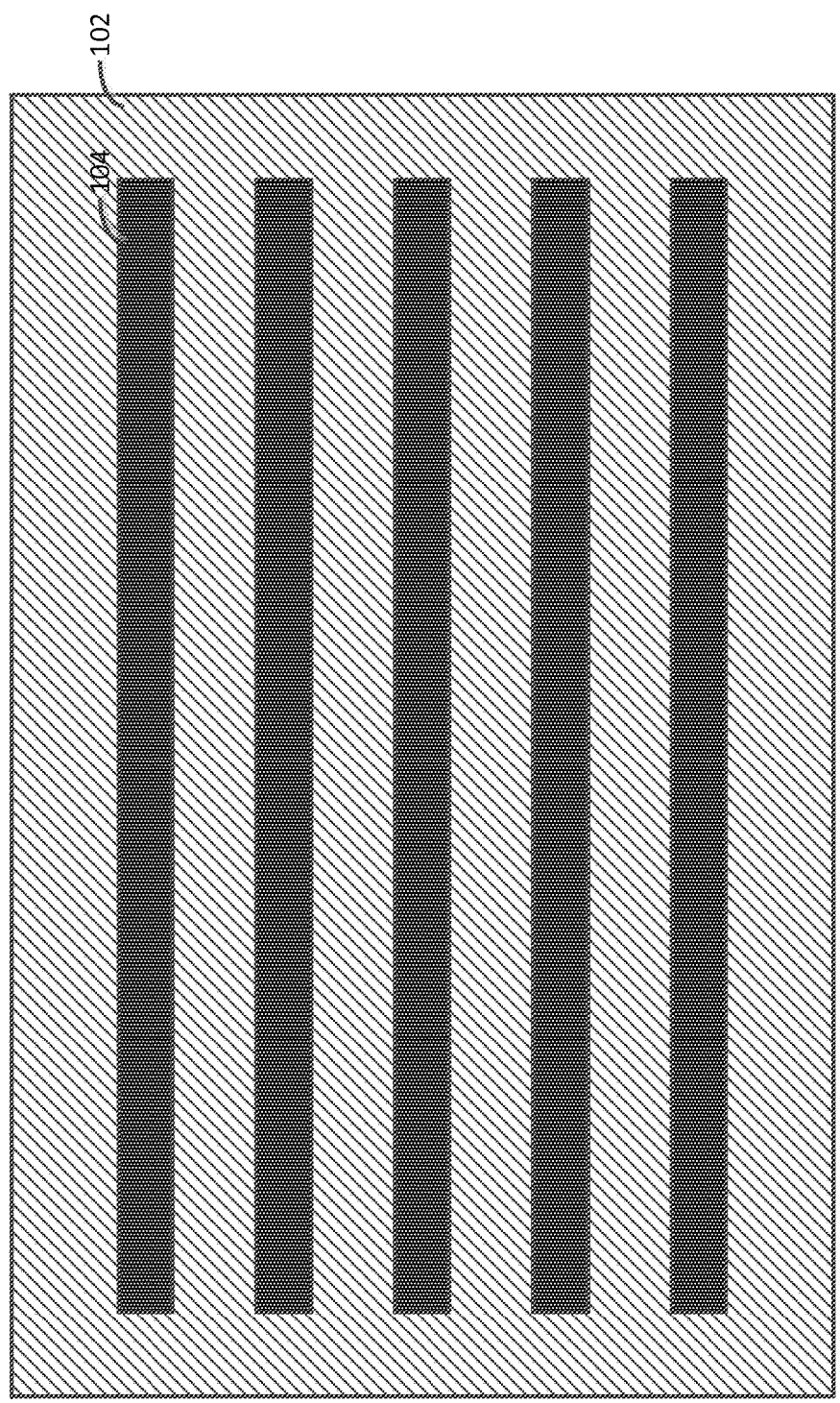
FIG. 1A illustrates a top view following the formation of semiconductor fins on a substrate.

FIG. 1A illustrates a top view following the formation of semiconductor fins 104 on a substrate 102 that may include an insulating material. In the illustrated embodiment, the fins 104 are formed on a semiconductor on insulator (SOI) wafer. The semiconductor fins 104 are formed from a strained layer of semiconductor material such that following the patterning of the fins 104 the fins remain substantially strained. The fins 104 may be formed by, for example, a lithographic patterning and etching process such as reactive ion etching.

An SOI wafer includes a thin layer of a semiconducting material atop an insulating layer (i.e., an oxide layer) which is in turn disposed on a silicon substrate. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Figure 1B:
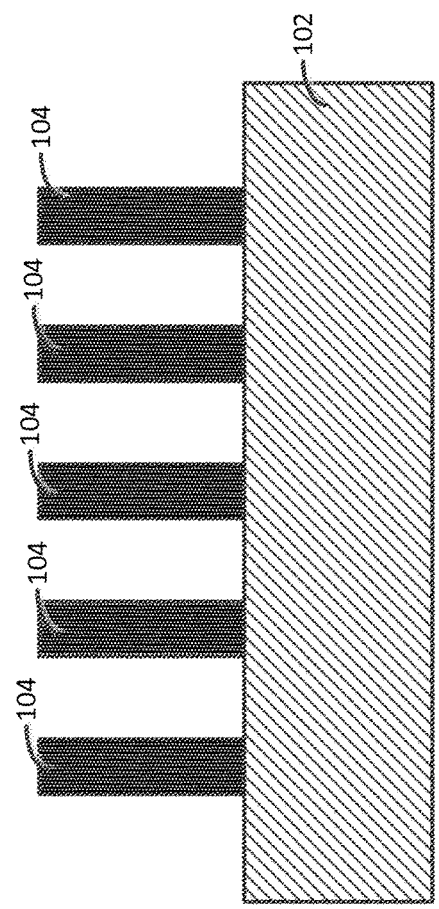
FIG. 1B illustrates a side view of the fins arranged on the substrate of FIG. 1A.

FIG. 1B illustrates a side view of the fins 104 arranged on the substrate 102 of FIG. 1A.

FIG. 2A illustrates a top view following the deposition of a silicon layer 202 over the fins 104 and the substrate 102 (of FIG. 1A). The silicon layer 202 of the illustrated embodiment includes amorphous silicon, or in some embodiments, polysilicon that may be deposited by, for example, a chemical vapor deposition process or a plasma enhanced chemical vapor deposition process. The silicon layer 202 is operative to maintain the strained state of the fins 104 when the fins etched ("cut") in subsequent processes described below.

Figure 2B:
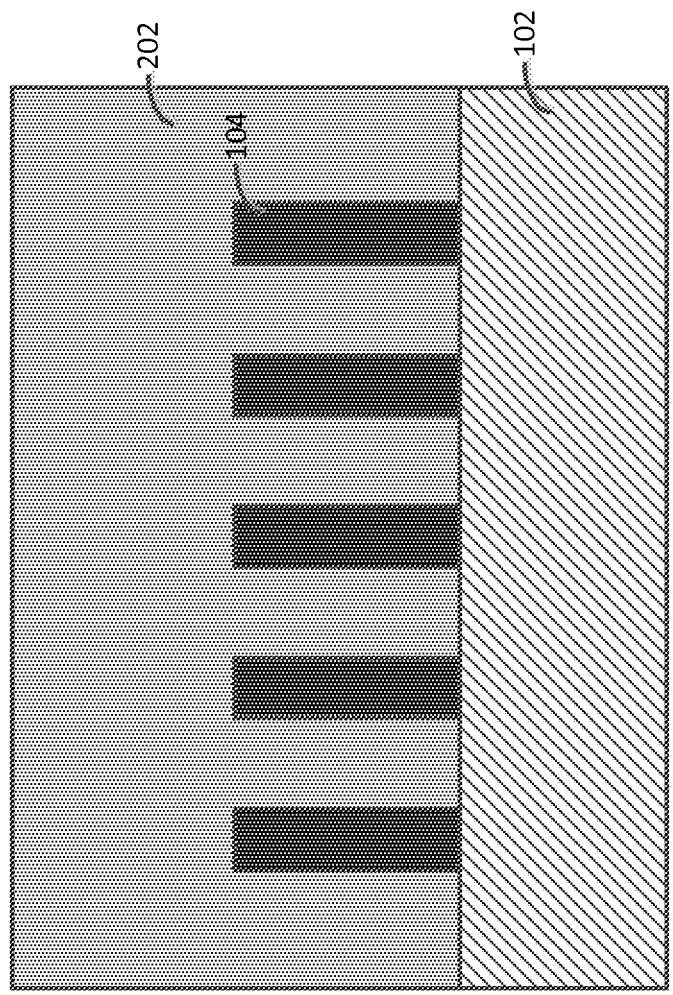
FIG. 2B illustrates a cut away view along the line A-A of FIG. 2A following the deposition of a silicon layer over the fins and the substrate.

FIG. 2B illustrates a cut away view along the line A-A of FIG. 2A.

Figure 3:
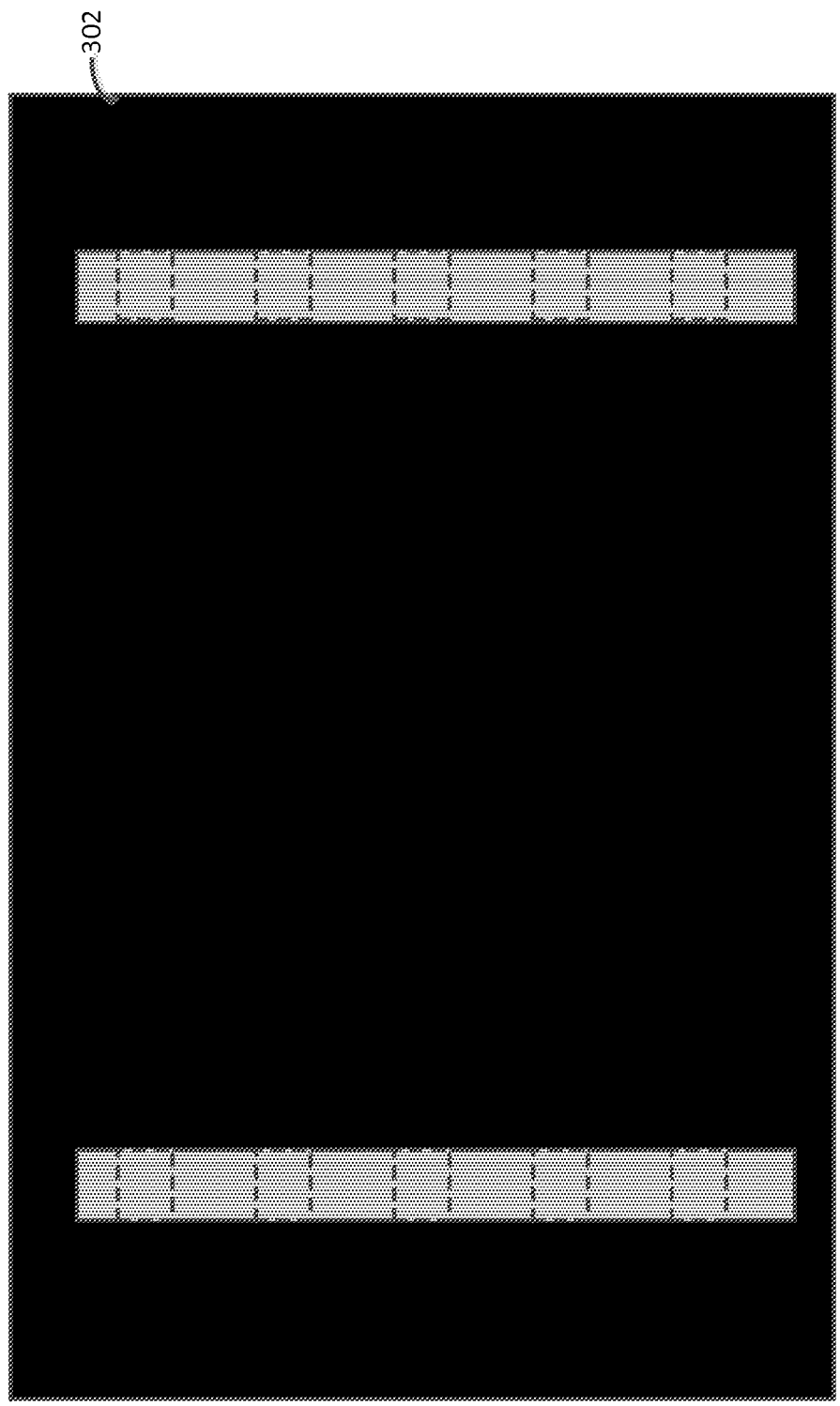
FIG. 3 illustrates a top view of a photolithographic mask that is patterned on the silicon layer.

FIG. 3 illustrates a top view of a photolithographic mask 302 that is patterned on the silicon layer 202 (of FIG. 2A). The mask 302 may include an organic material. The mask 302 defines regions of the silicon layer 202 and the fins 104 that will be subsequently etched.

Figure 4A:
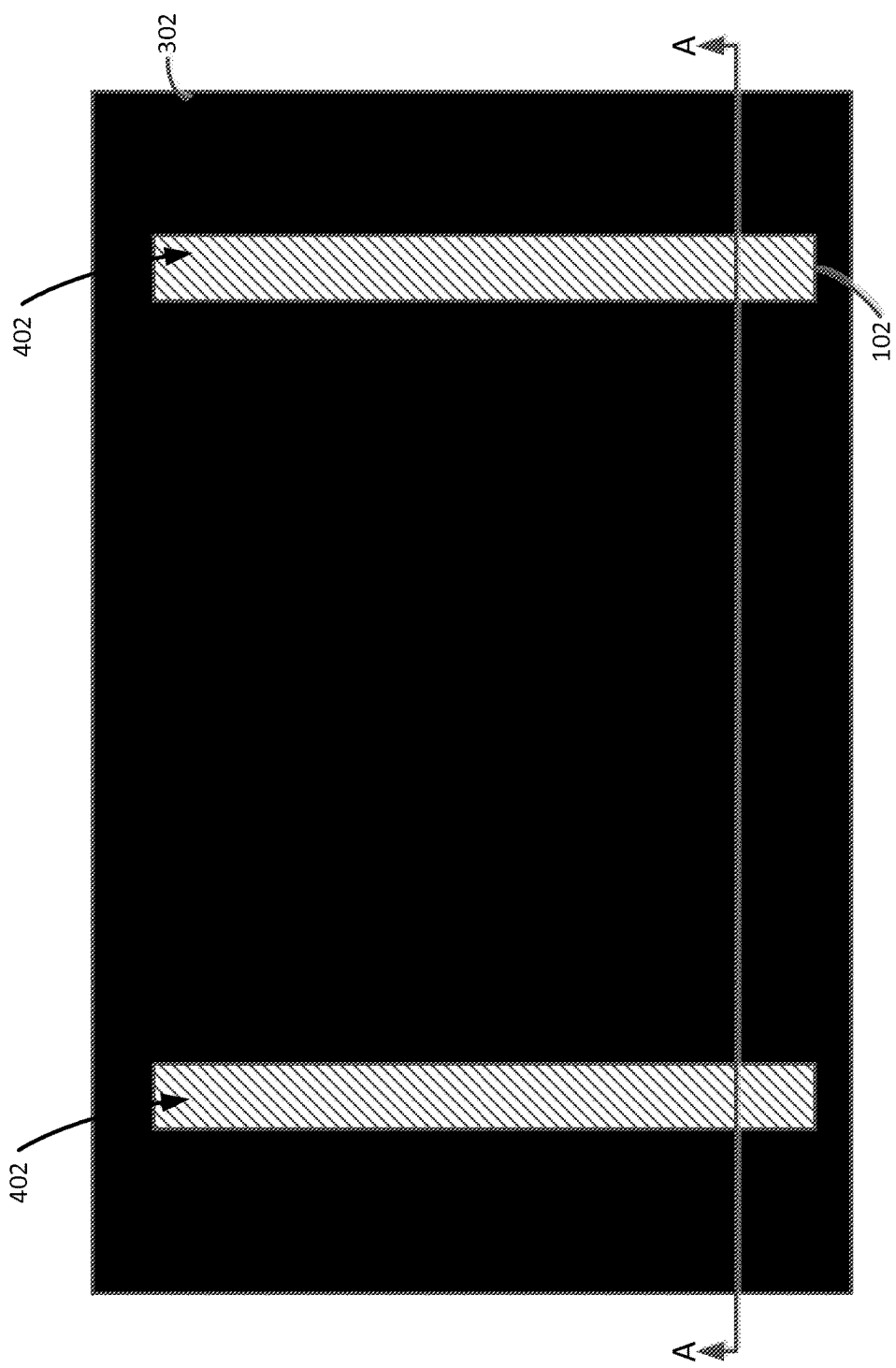
FIG. 4A illustrates a top view of the resultant structure following an etching process.

FIG. 4A illustrates a top view of the resultant structure following an etching process such as, for example, reactive ion etching that removes exposed portions of the silicon layer 202 and the fins 104 to form a fin cut region 402 that exposes portions of the substrate 102.

Figure 4B:
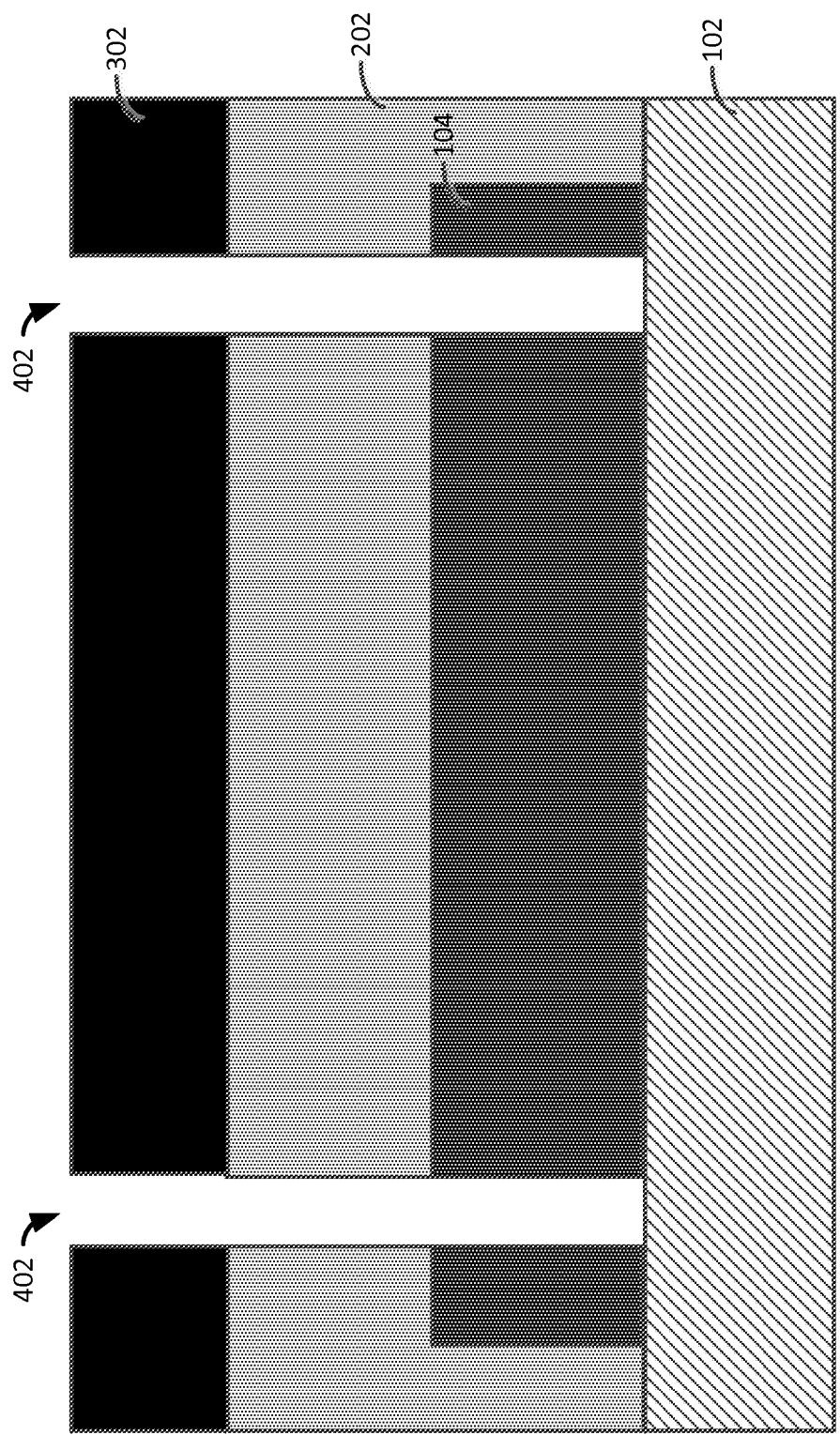
FIG. 4B illustrates a cut away view along the line A-A of FIG. 4A of the resultant structure following an etching process.

FIG. 4B illustrates a cut away view along the line A-A of FIG. 4A. In this regard, the fin 104 has been cut into three segments following the formation of the fin cut region 402.

Figure 5A:
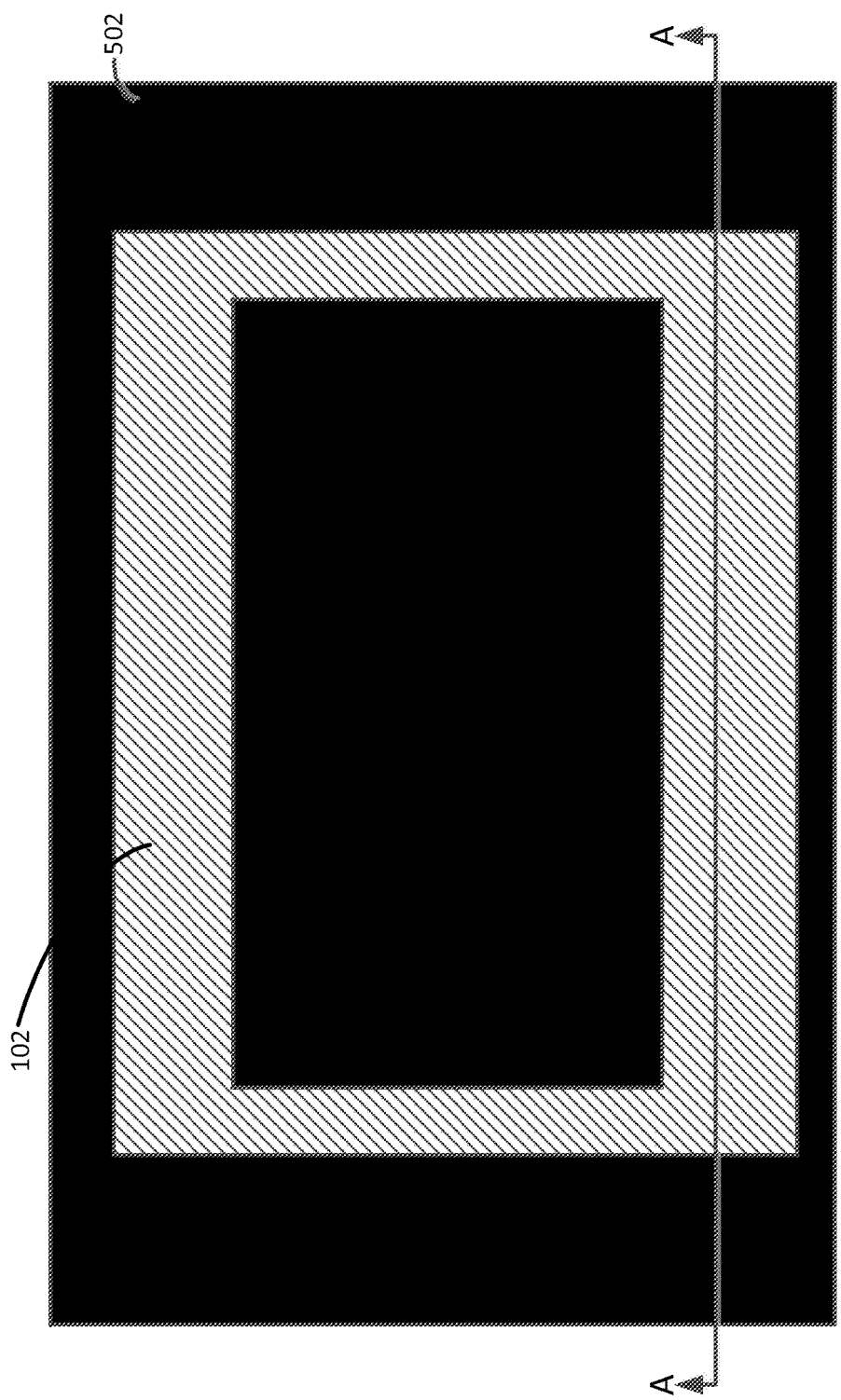
FIG. 5A illustrates a top view of the mask that further defines the fin cut region.

FIG. 5A illustrates a top view of the mask 502 that further defines the fin cut region 402 (of FIG. 4A) following the patterning of the mask 502 and an etching process such as, for example, reactive ion etching that removes exposed portions of the fins 104 and the silicon layer 202 to expose portions of the substrate 102.

Figure 5B:
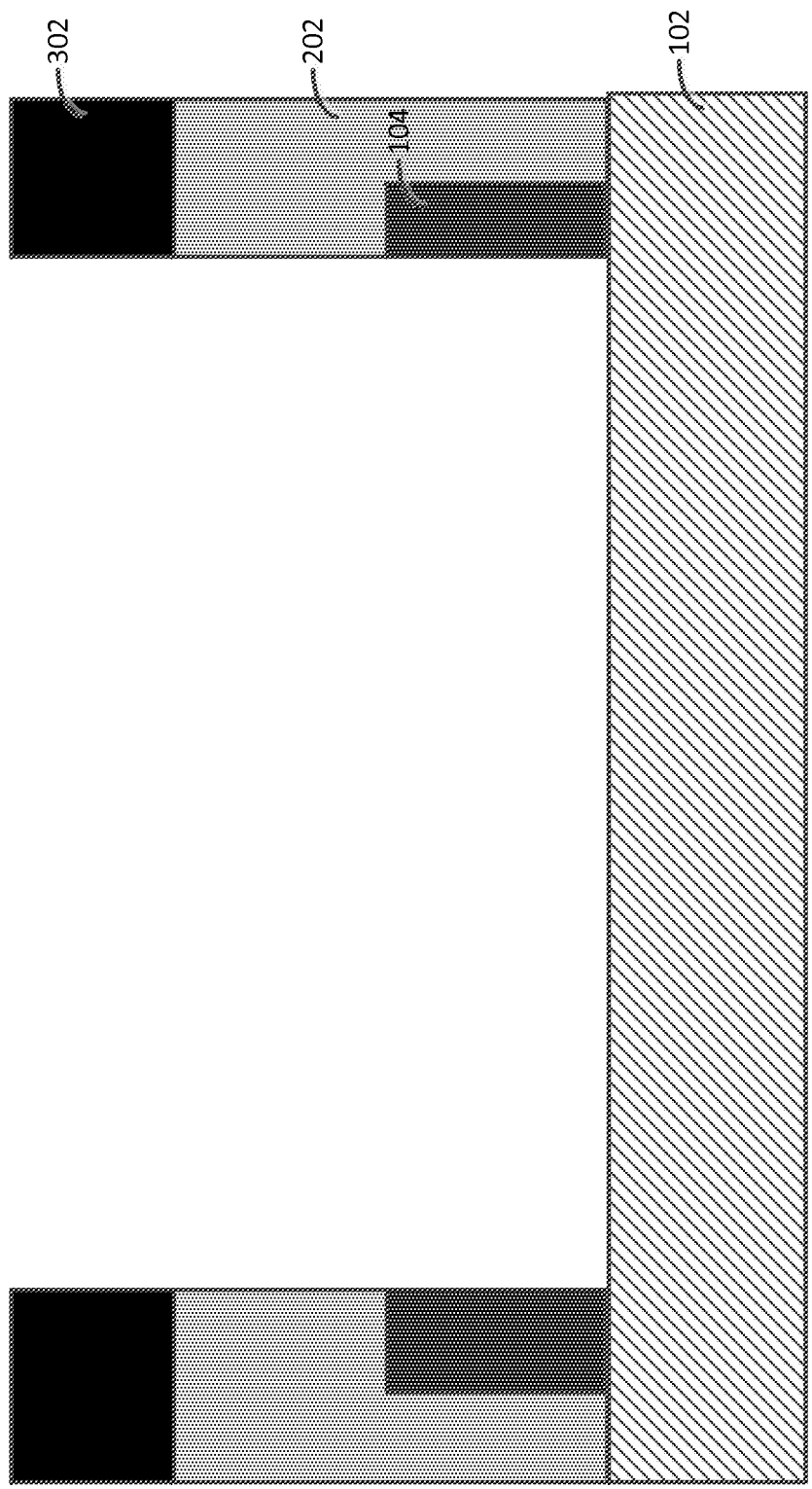
FIG. 5B illustrates a cut away view along the line A-A of FIG. 5A that includes the mask.

FIG. 5B illustrates a cut away view along the line A-A of FIG. 5A. In the illustrated embodiment, the fin 104 has been further cut to remove the medial region of the fin 104 (shown in FIG. 4A) resulting in a fin 104 with two fin segments.

In the illustrated embodiment, the fins 104 may be cut using a single masking and etching process or more than one masking and etching processes.

Figure 6:
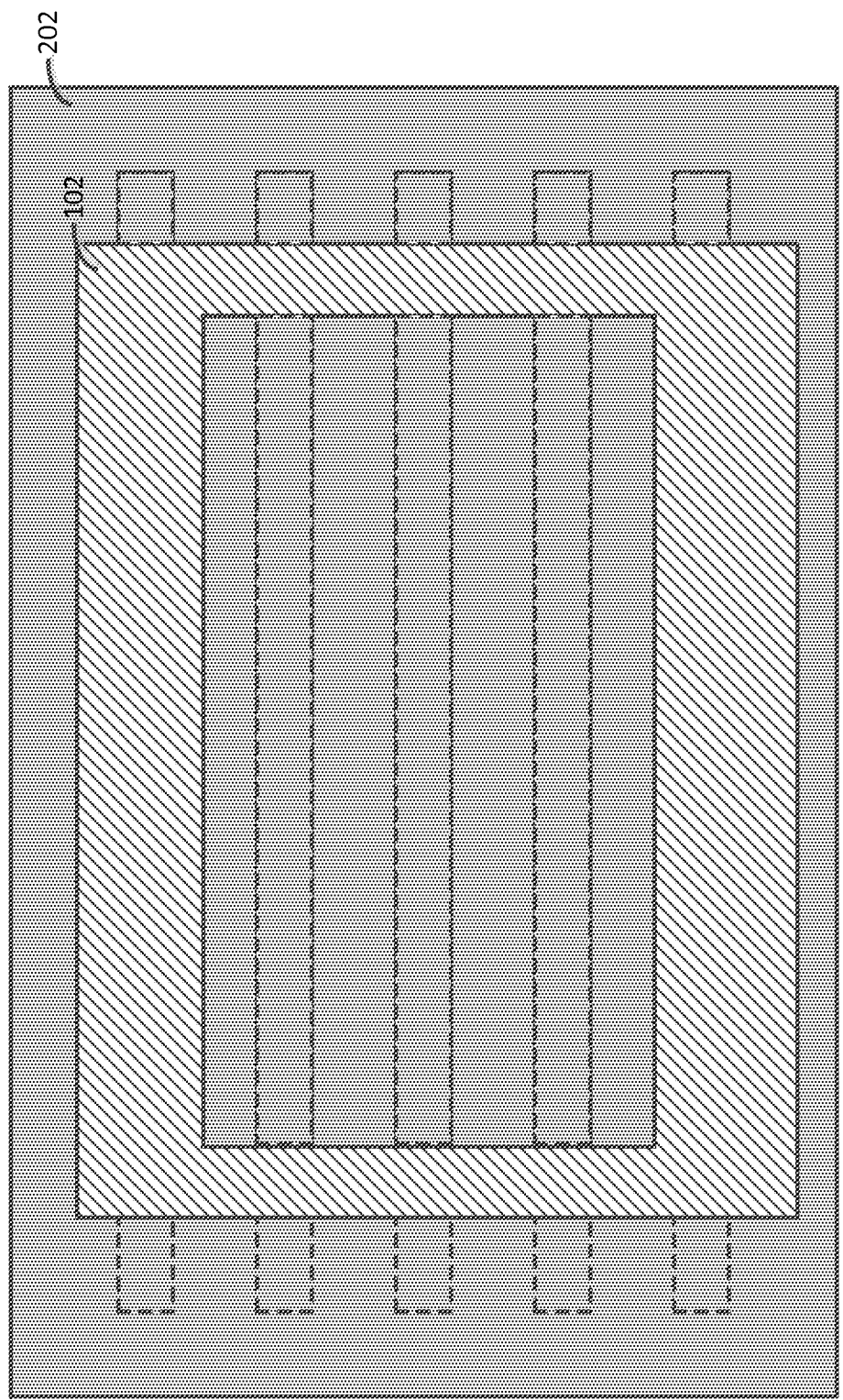
FIG. 6 illustrates a top view of the resultant structure following the removal of the masks.

FIG. 6 illustrates a top view of the resultant structure following the removal of the masks to expose the semiconductor layer 202 and portions of the substrate 102.

Figure 7A:
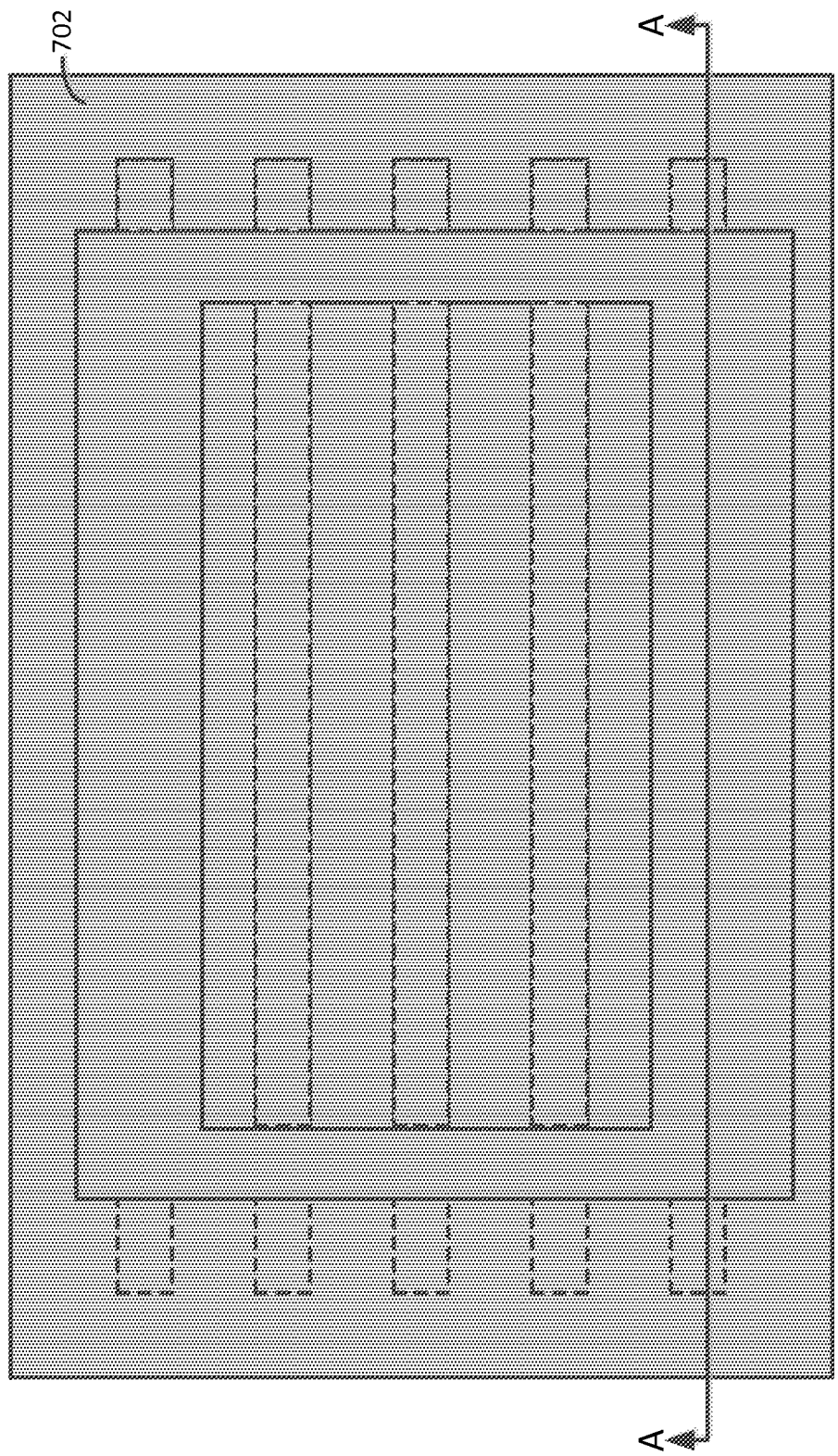
FIG. 7A illustrates a top view following the deposition of a second silicon layer.

FIG. 7A illustrates a top view following the deposition of a second silicon layer 702. The second silicon layer may include, for example, amorphous or polysilicon material that may be deposited by chemical vapor deposition or plasma enhanced chemical vapor deposition processes. The second silicon layer 702 is deposited over the second silicon layer 202 (of FIG. 6) and exposed portions of the substrate 102. Following the deposition of the second silicon layer 702, a planarization process may be performed.

Figure 7B:
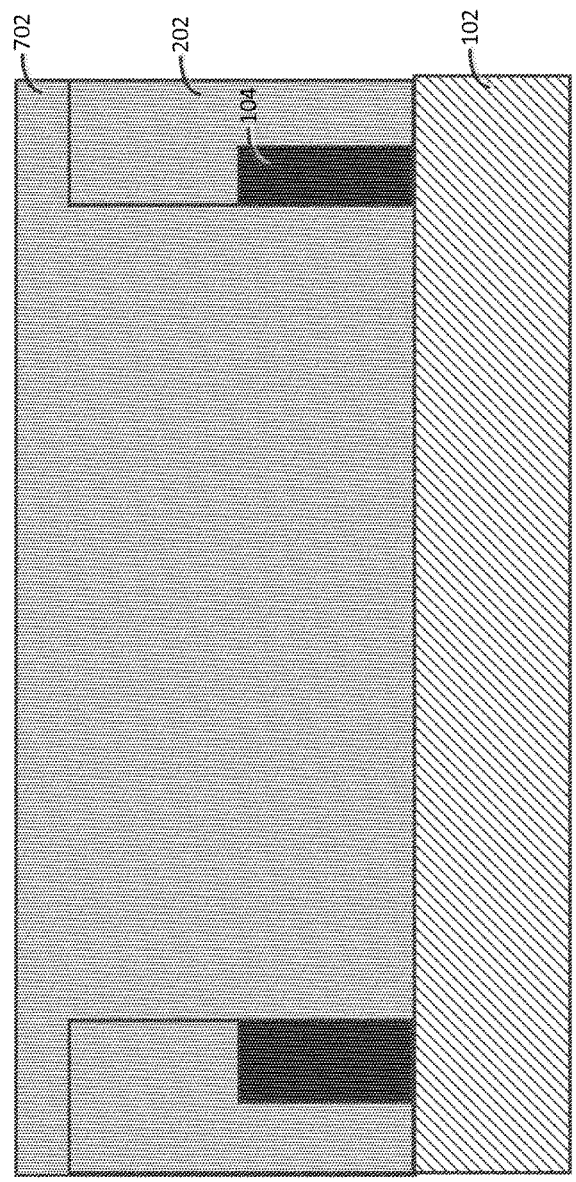
FIG. 7B illustrates a cut away view along the line A-A of FIG. 7A following the deposition of a second silicon layer.

FIG. 7B illustrates a cut away view along the line A-A of FIG. 7A following the deposition of a second silicon layer.

Figure 8:
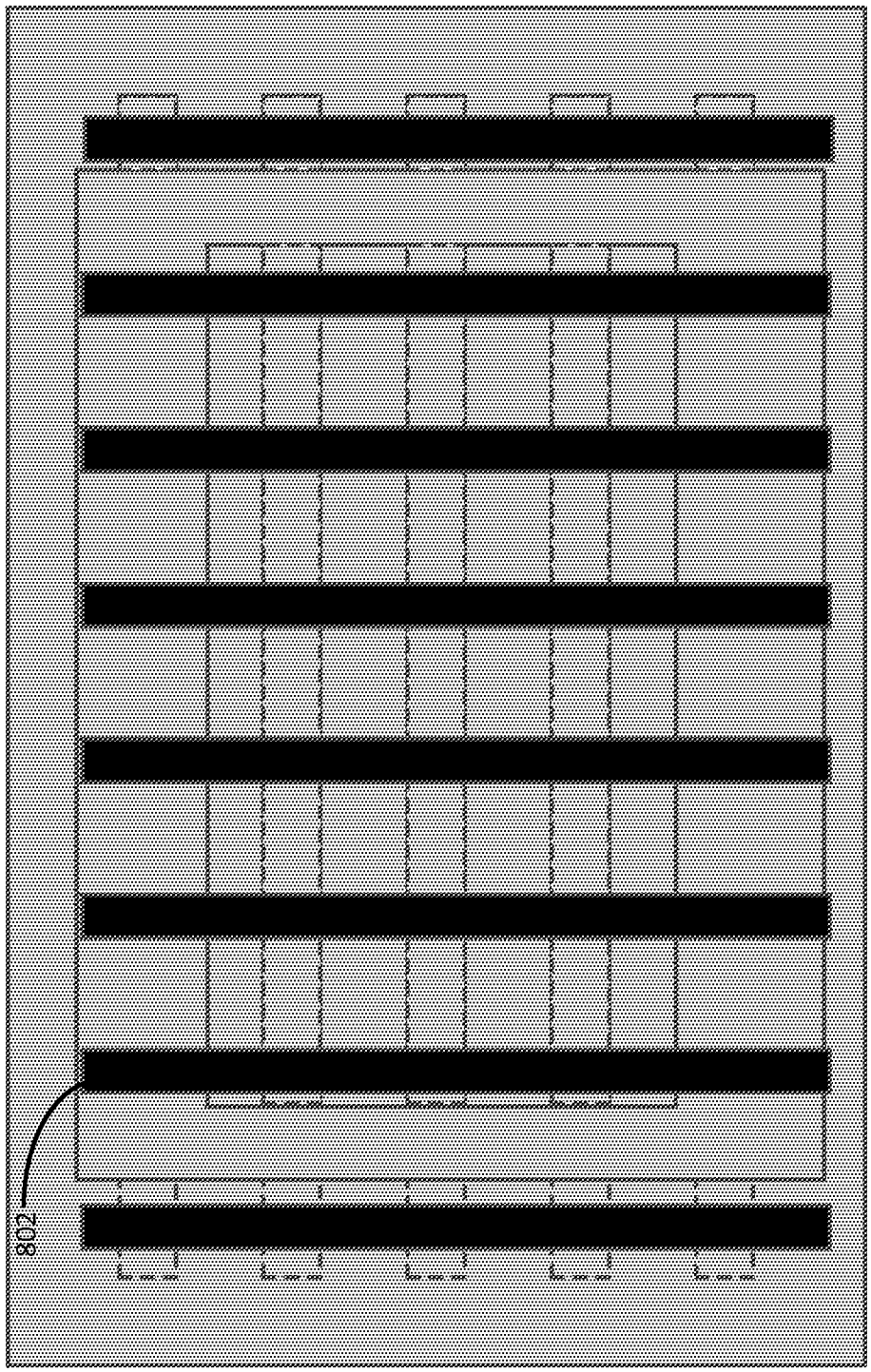
FIG. 8 illustrates a top view following the patterning of a mask that defines dummy (sacrificial) gates.

FIG. 8 illustrates a top view following the patterning of a mask 802 that defines dummy (sacrificial) gates. The mask 802 may include, for example, an organic mask material that is photolithographically patterned on the second silicon layer 702 (of FIG. 7A).

Figure 9A:
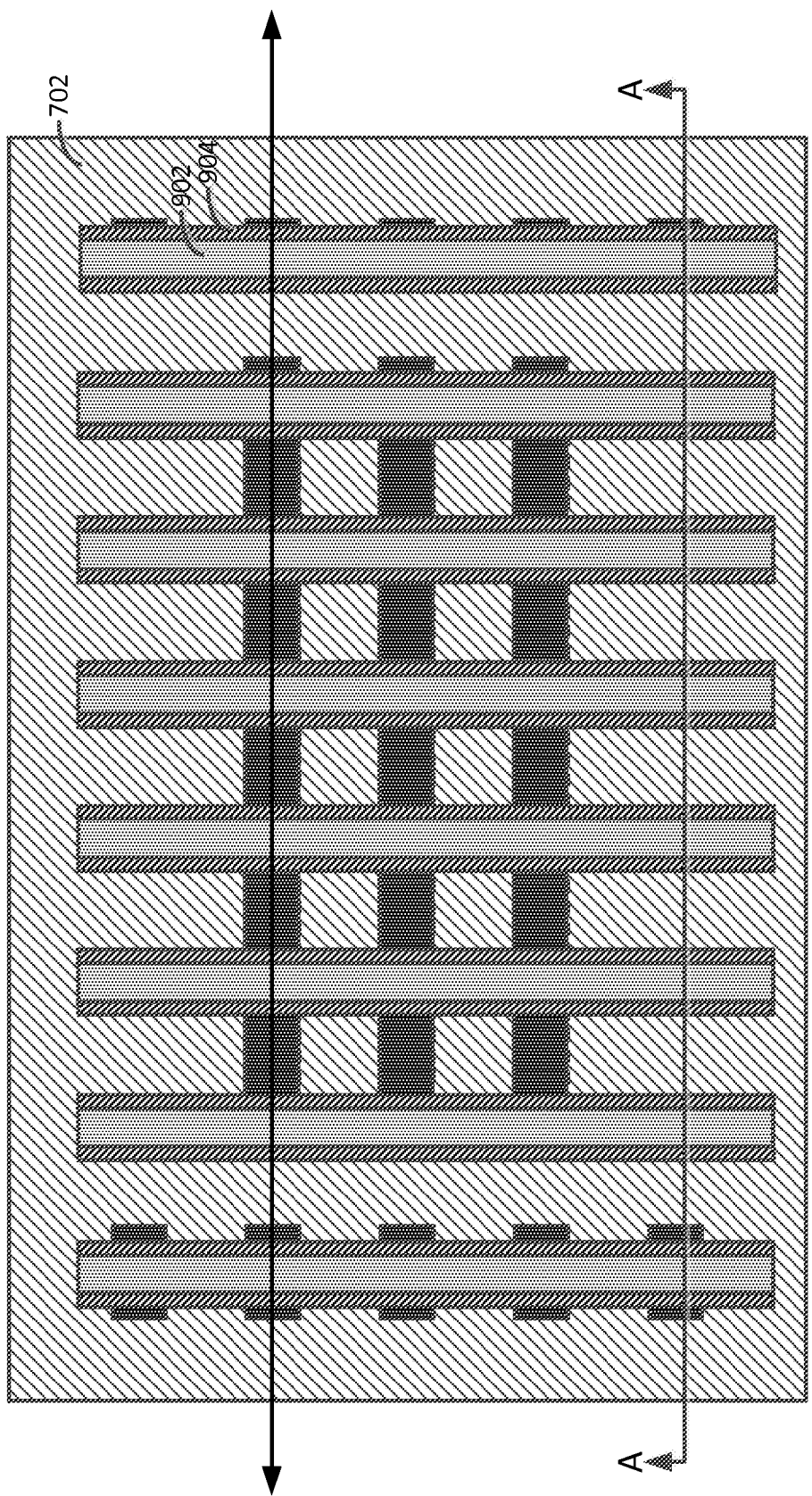
FIG. 9A illustrates a top view of the resultant structure following an anisotropic etching process.

FIG. 9A illustrates a top view of the resultant structure following an anisotropic etching process such as, for example, reactive ion etching that is selective to the silicon material of the first and second silicon layers 202 and 702 that defines dummy (sacrificial) gate stacks 902. The dummy gate stacks 902 are arranged conformally over the fins 104.

The dummy gate stacks 902 are operative to substantially maintain the strain in the fins 104 particularly in the channel regions of the fins. However, the arrangement of the dummy gate stacks 902 contributes to substantially maintaining the strain across the fins 104.

Following the formation of the dummy gate stacks 902, spacers may be formed adjacent to the longitudinal sidewalls of the dummy gate stacks. The spacers may be formed by, for example, depositing a material such as, an oxide or nitride material conformally over the dummy gate stacks 902. Following the deposition of the spacer material, an anisotropic etching process such as reactive ion etching is performed to define the spacers 904.

Figure 9B:
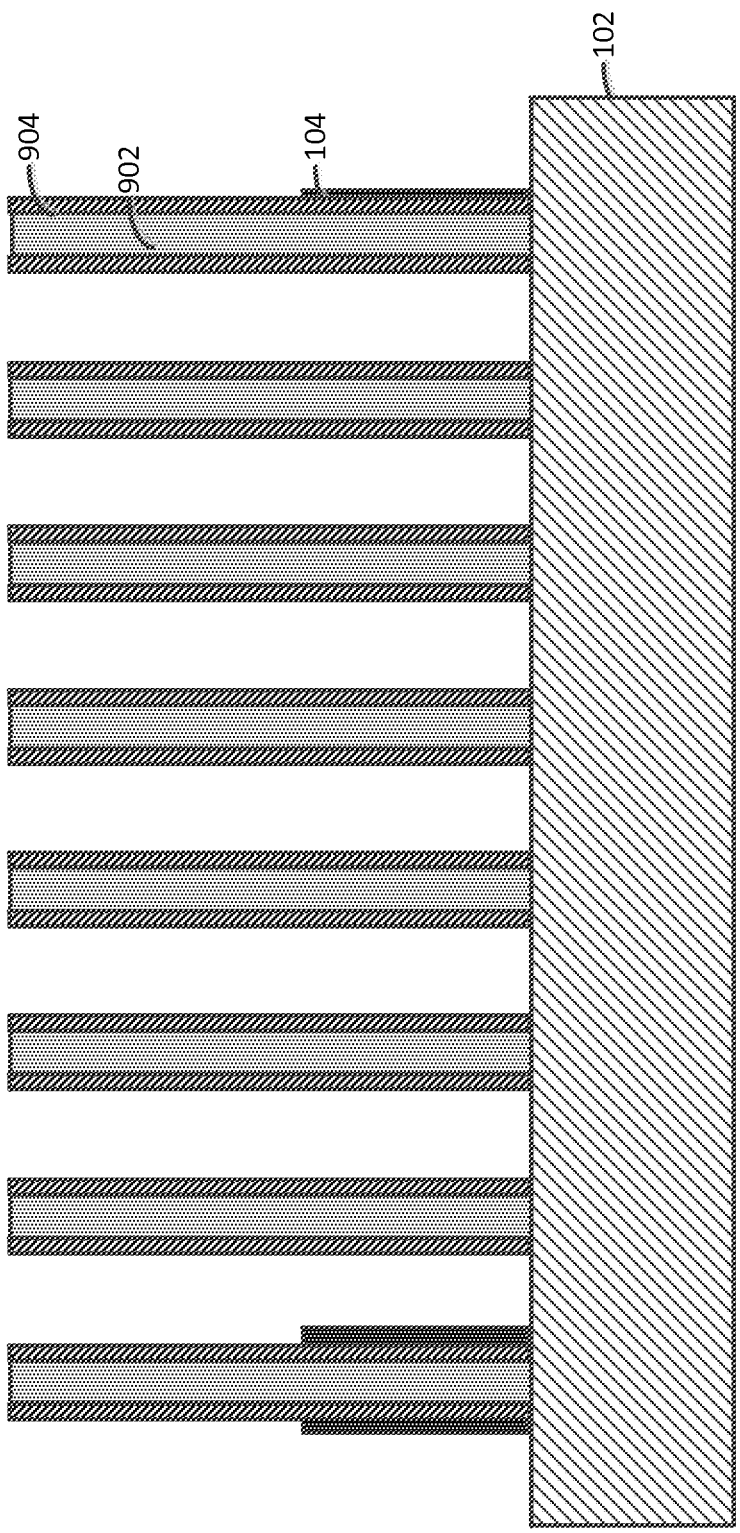
FIG. 9B illustrates a cut away view along the line A-A of FIG. 9A.

FIG. 9B illustrates a cut away view along the line A-A of FIG. 9A showing the fins 902 and spacers 904 formed over the fins 104.

Figure 10:
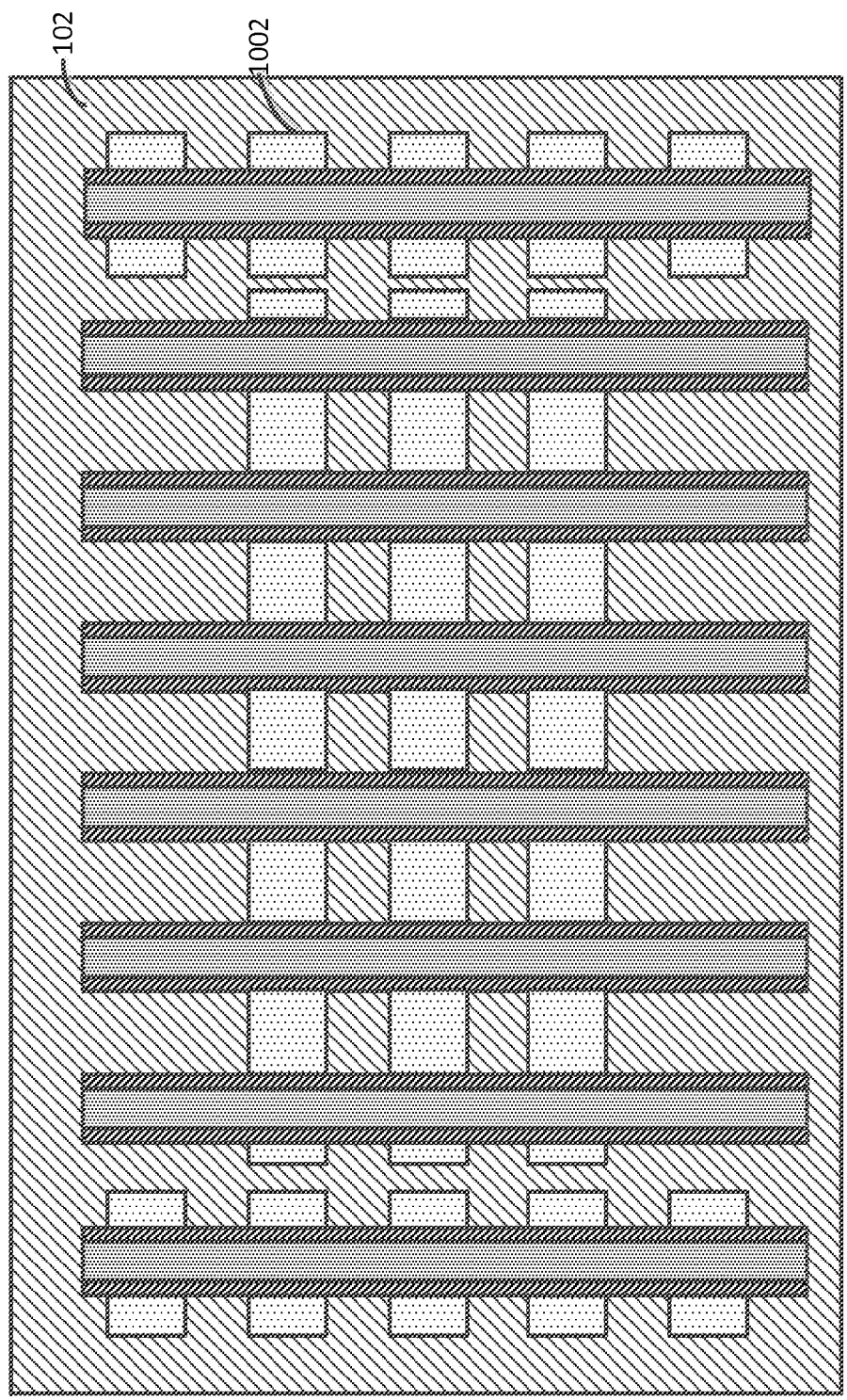
FIG. 10 illustrates a top view of the resultant structure following the formation of epitaxially grown source/drain regions.

FIG. 10 illustrates a top view of the resultant structure following the formation of epitaxially grown source/drain regions 1002. An epitaxial growth process is performed to deposit a crystalline layer onto a crystalline substrate beneath. The underlying substrate acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor. Alternatively, the source/drain regions 1002 may be doped following the epitaxial growth process using, for example, an ion implantation and annealing process that implants dopants into the exposed portions of the source/drain regions 1002.

Figure 11:
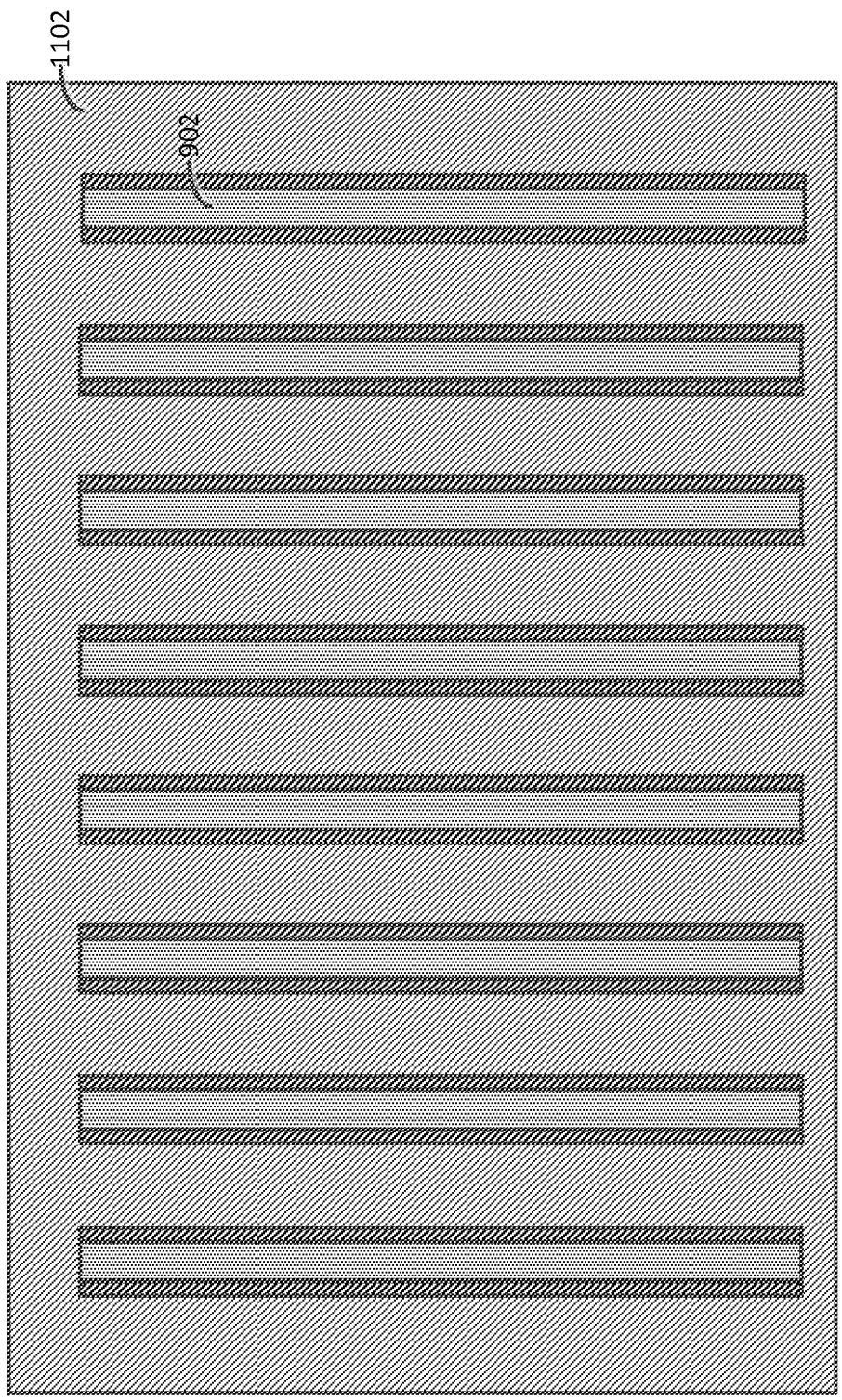
FIG. 11 illustrates a top view of the resultant structure following the deposition of an insulator layer.

FIG. 11 illustrates a top view of the resultant structure following the deposition of an insulator layer 1102 that may include, for example, a dielectric material such as an oxide material. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. Following the deposition of the insulator layer 1102, a planarization process such as, for example chemical mechanical polishing may be performed to expose the dummy gate stacks 902.

Figure 12:
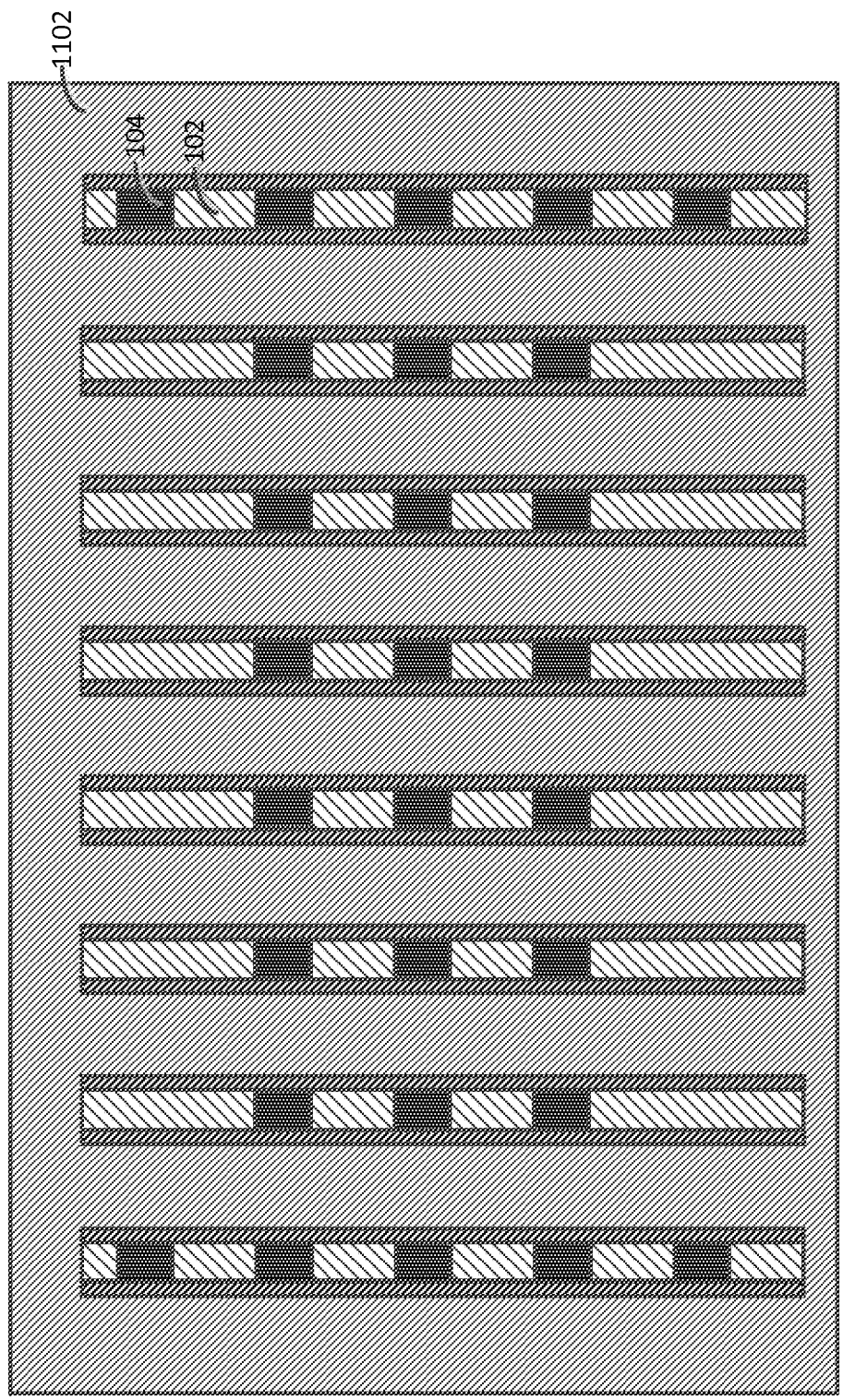
FIG. 12 illustrates a top view following the removal of the exposed portions of the dummy gate stacks.

FIG. 12 illustrates a top view following the removal of the exposed portions of the dummy gate stacks 902 using a suitable selective etching process such as, for example, a chemical etching process that selectively removes the exposed dummy gate stack 902 silicon material and exposes channel regions of the fins 104 and portions of the substrate 102.

Figure 13:
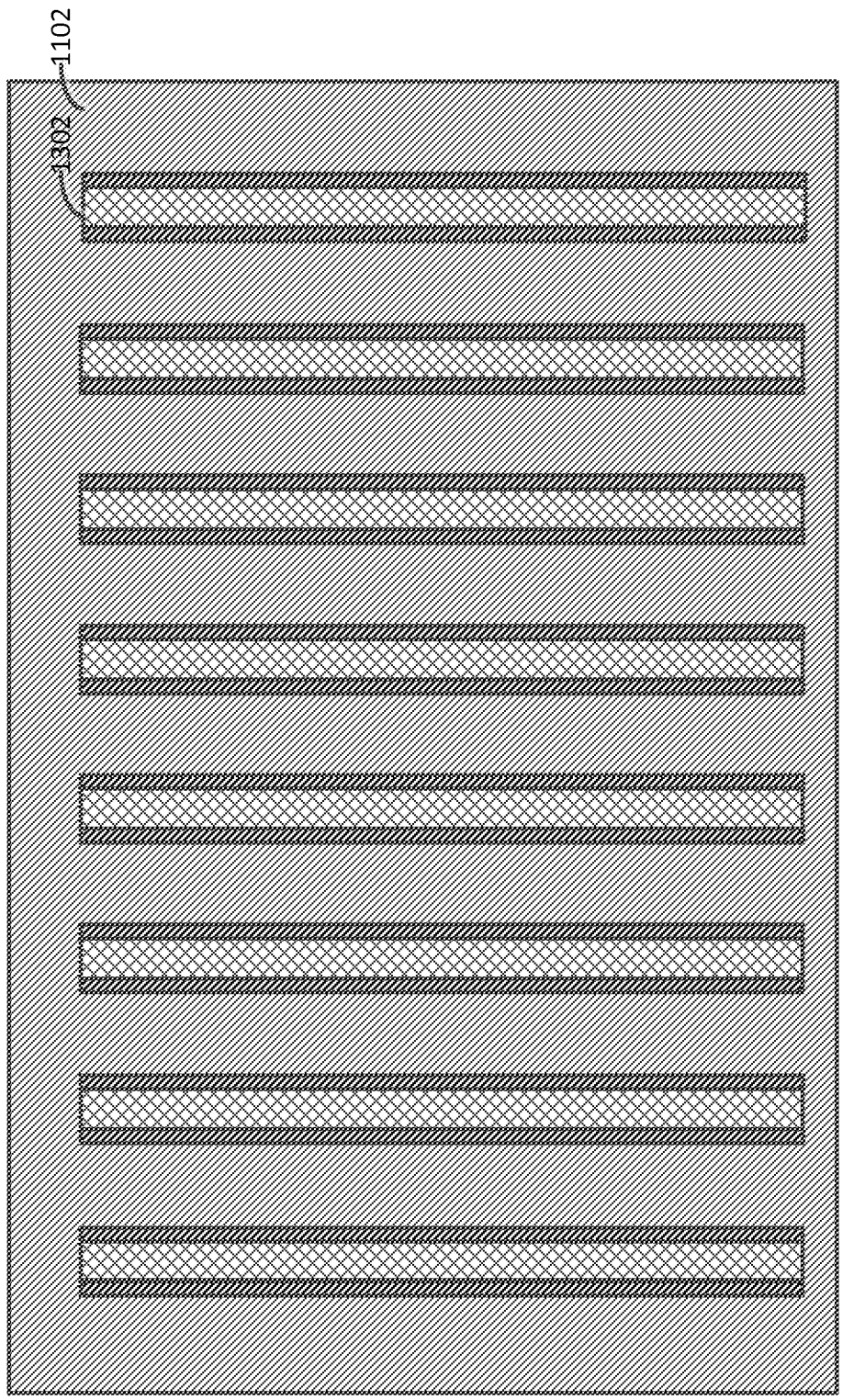
FIG. 13 illustrates the resultant structure following the formation of replacement metal gate stacks.

FIG. 13 illustrates the resultant structure following the formation of replacement metal gate stacks 1302. The gate stack 1302 includes high-k metal gates formed, for example, by filling a dummy gate opening (not shown) with one or more high-k dielectric materials, one or more workfunction metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

A high-k dielectric material layer (not shown) may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

A work function metal(s) (not shown) may be disposed over the high-k dielectric material. The type of work function metal(s) depends on the type of transistor and may differ between an NFET and a PFET device. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and workfunction layer(s) to form the gate stacks 1302. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

A planarization process, for example, chemical mechanical planarization (CMP), is performed to polish the surface of the conductive gate metal.

Following the formation of the gate stacks 1302, subsequent fabrication processes may be performed that remove portions of the insulator layer 1102 to expose the source/drain regions 1002 and form conductive contacts that provide an electrical connection to the source/drain regions 1002.

Figure 14:
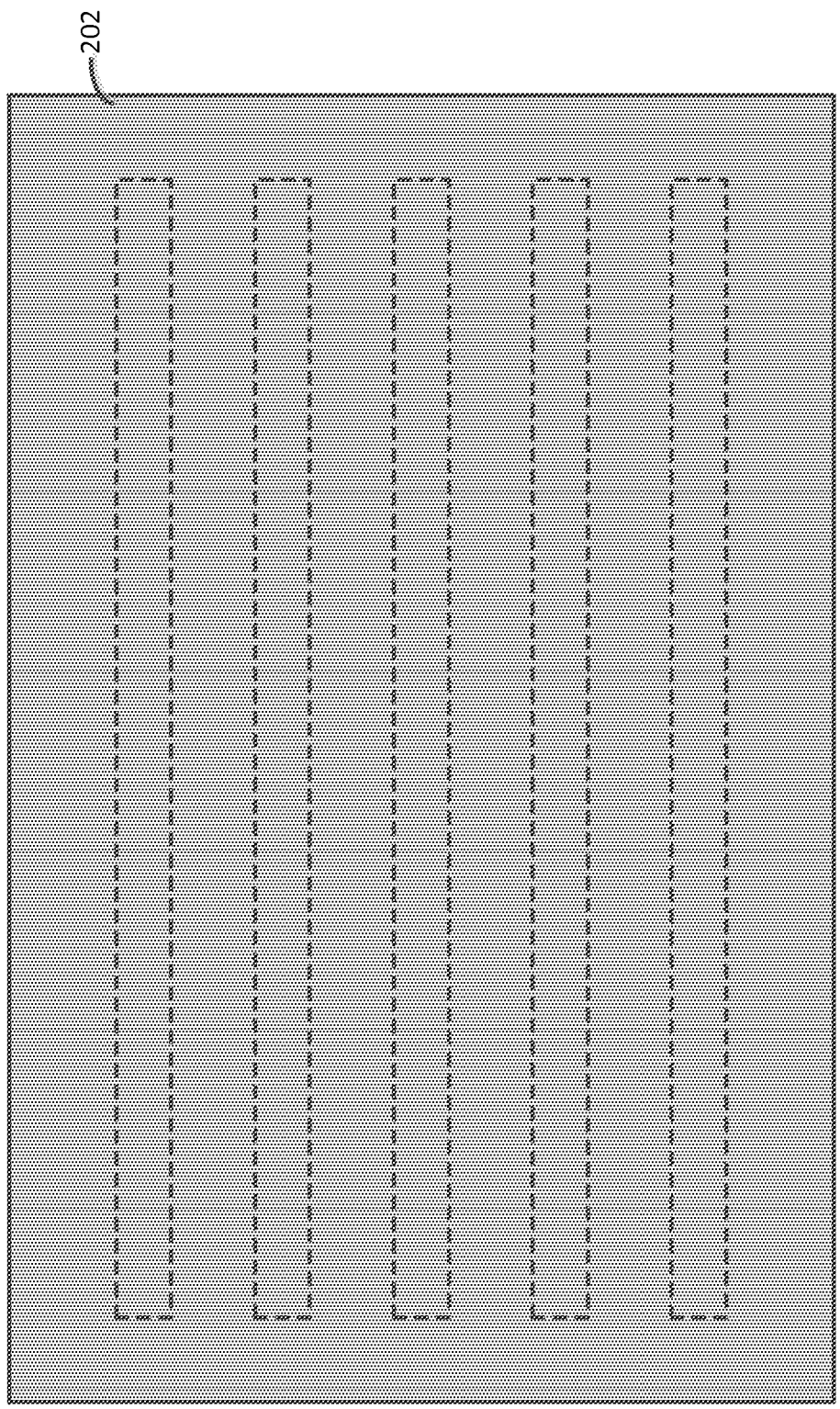

FIGS. 14-17B illustrate an alternate exemplary method of fabricating a strained finFET device. In this regard, FIG. 14 is the same as FIG. 2A discussed above and includes a silicon layer 202 arranged over the substrate 102 and fins 104 (of FIG. 1A).

Figure 15A:
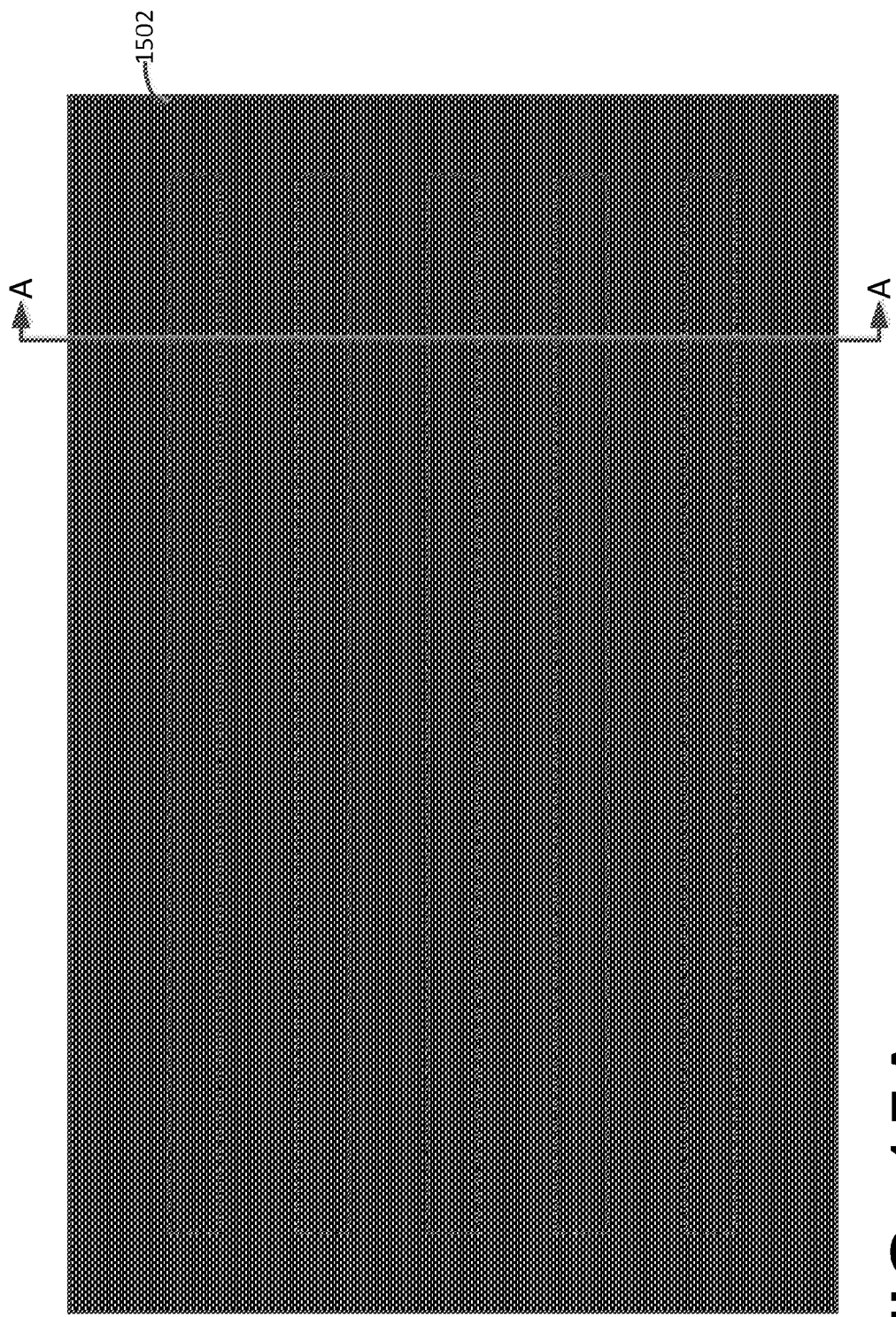
FIG. 15A illustrates the formation of a hardmask layer that is formed over the silicon layer.
Figure 15B:
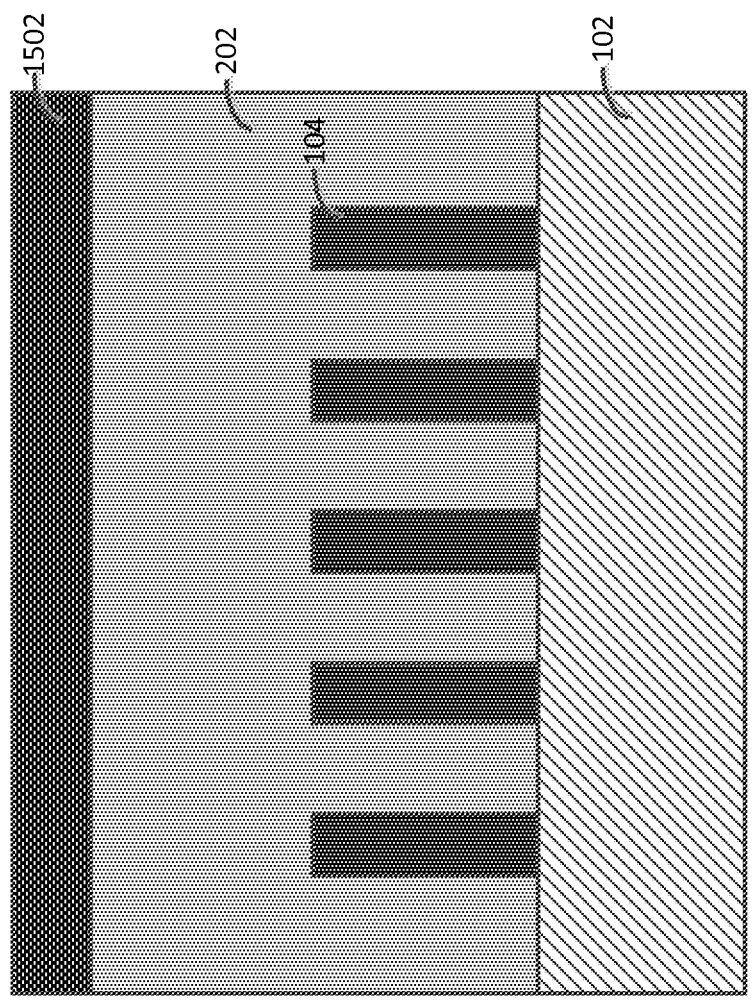
FIG. 15B illustrates a cut away view along the line A-A of FIG. 15A showing the hardmask layer.

FIG. 15A illustrates the formation of a hardmask layer 1502 that is formed over the silicon layer 202. Non-limiting examples of suitable materials for the hard mask layer 1502 include silicon oxide, silicon nitride, or any combination thereof. FIG. 15B illustrates a cut away view along the line A-A of FIG. 15A showing the hardmask layer 1502 arranged on the silicon layer 202.

Figure 16A:
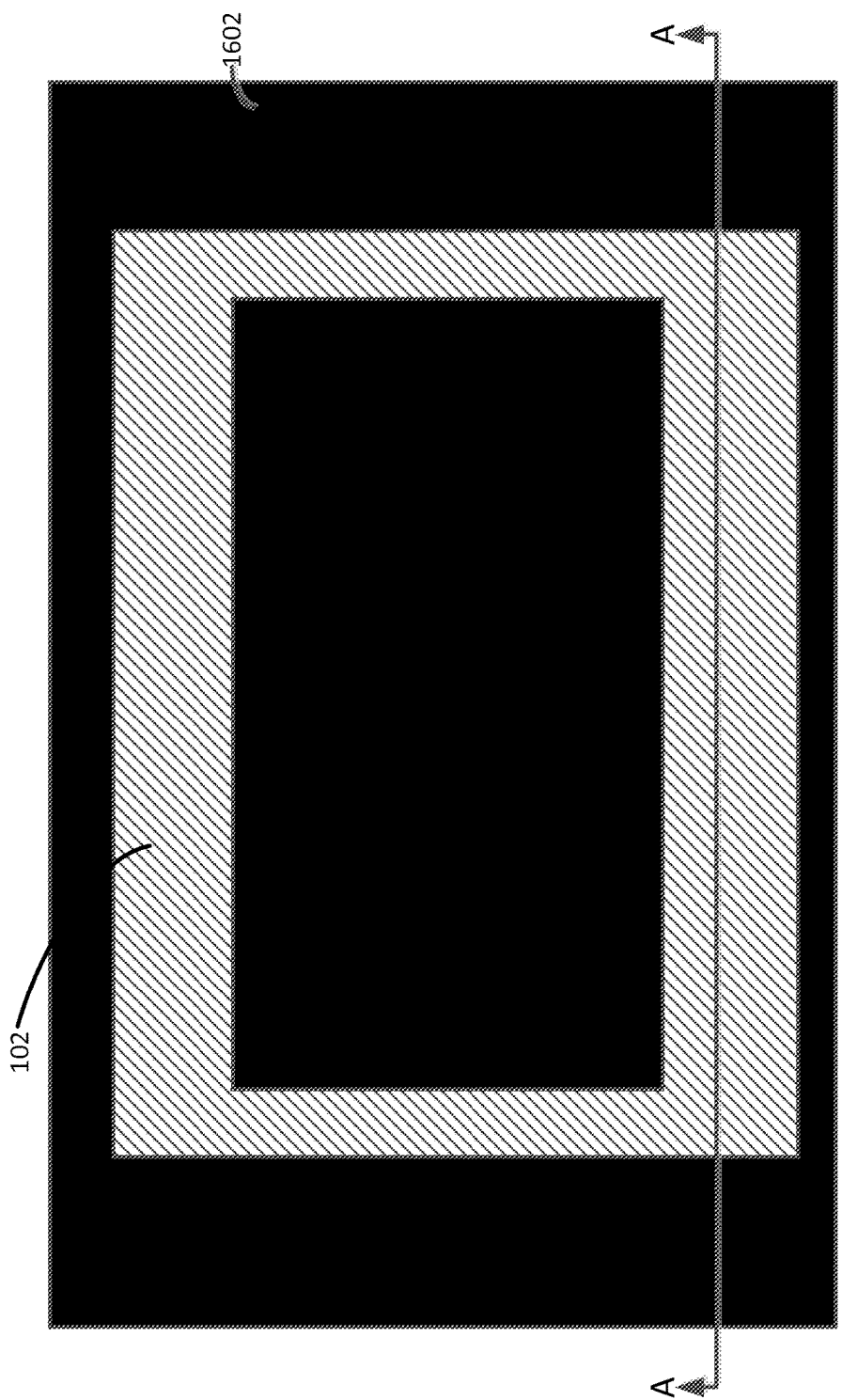
FIG. 16A illustrates the formation of a mask that is formed on the hardmask layer.
Figure 16B:
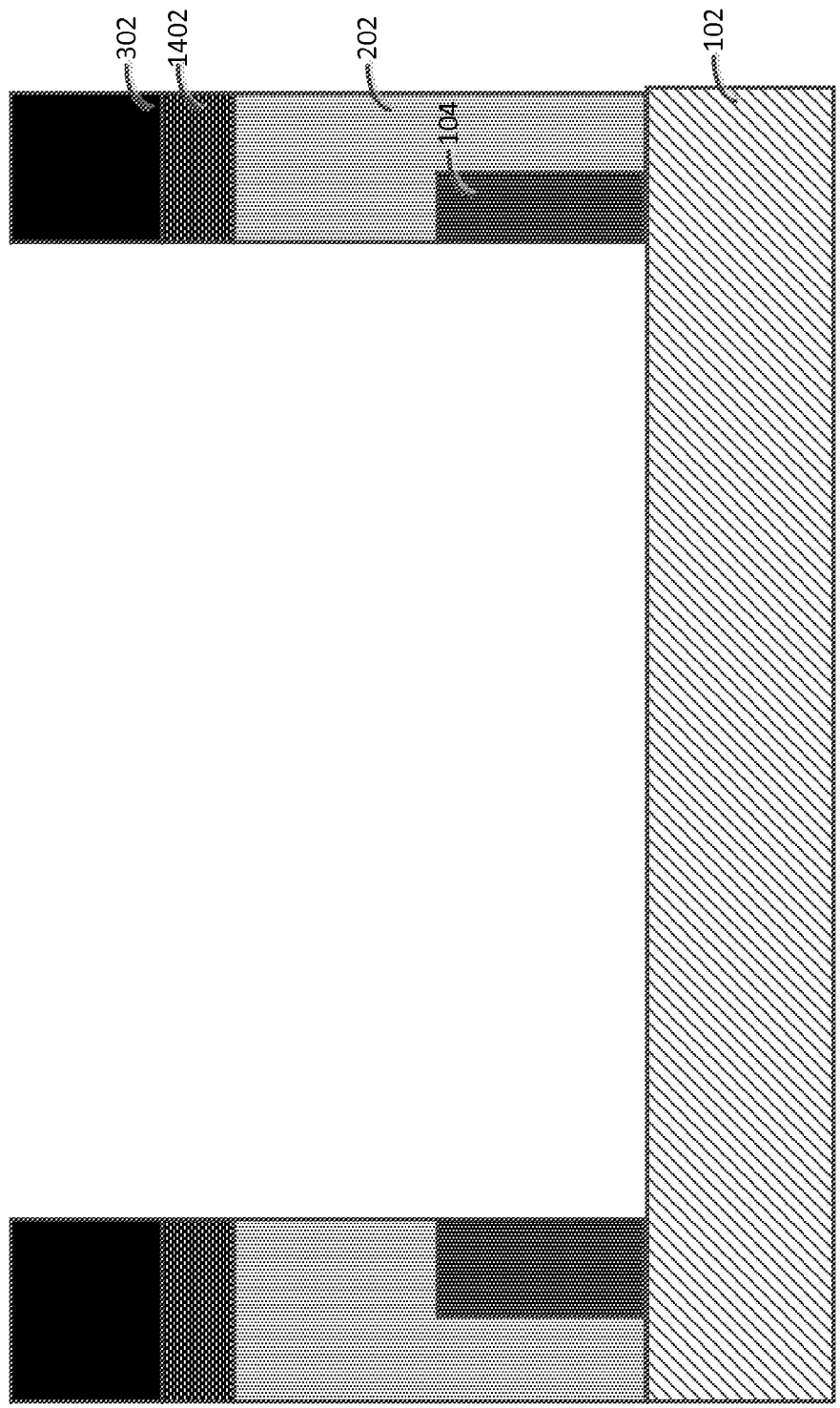
FIG. 16B illustrates a cut away view along the line A-A of FIG. 16A.

FIG. 16A illustrates the formation of a mask 1602 that is formed on the hardmask layer 1502 (of FIG. 15A) that defines regions of the fins 104 that have been removed using a suitable anisotropic etching process such as, for example, reactive ion etching that exposes portions of the substrate 102. FIG. 16B illustrates a cut away view along the line A-A of FIG. 16A.

Figure 17A:
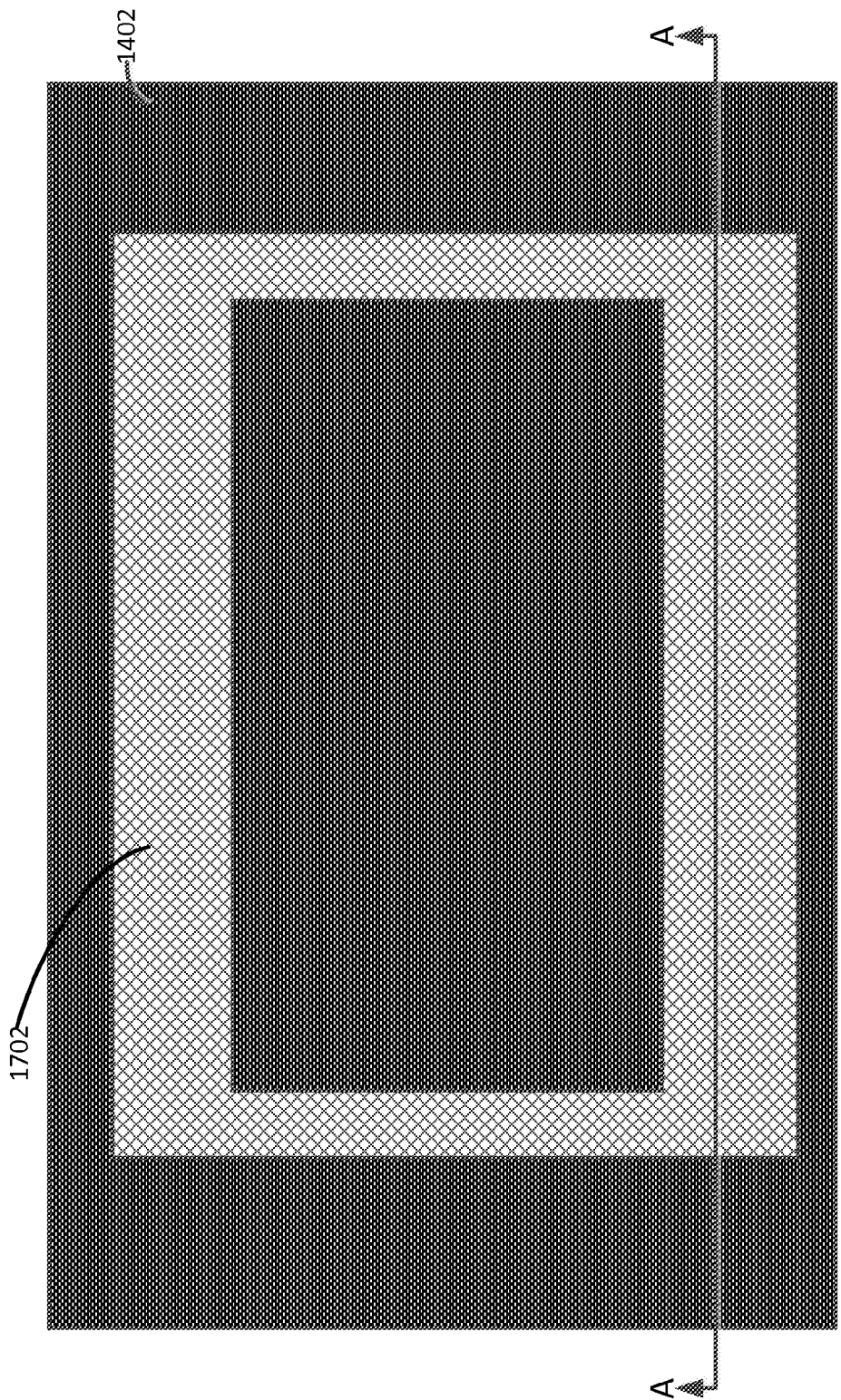
FIG. 17A illustrates a top view following the formation of a silicon trench isolation (STI) region.

FIG. 17A illustrates a top view following the formation of a silicon trench isolation (STI) region 1702. The STI region 1702 is formed by depositing an oxide material in the cavity formed by the previous etching process to form the STI regions 1702. Non-limiting examples of suitable oxide materials for the STI regions 1702 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or any combination thereof. Following the deposition of the STI 1702 material, a planarization process such, as, for example, chemical mechanical polishing may be performed that stops on the hardmask layer 1502.

Figure 17B:
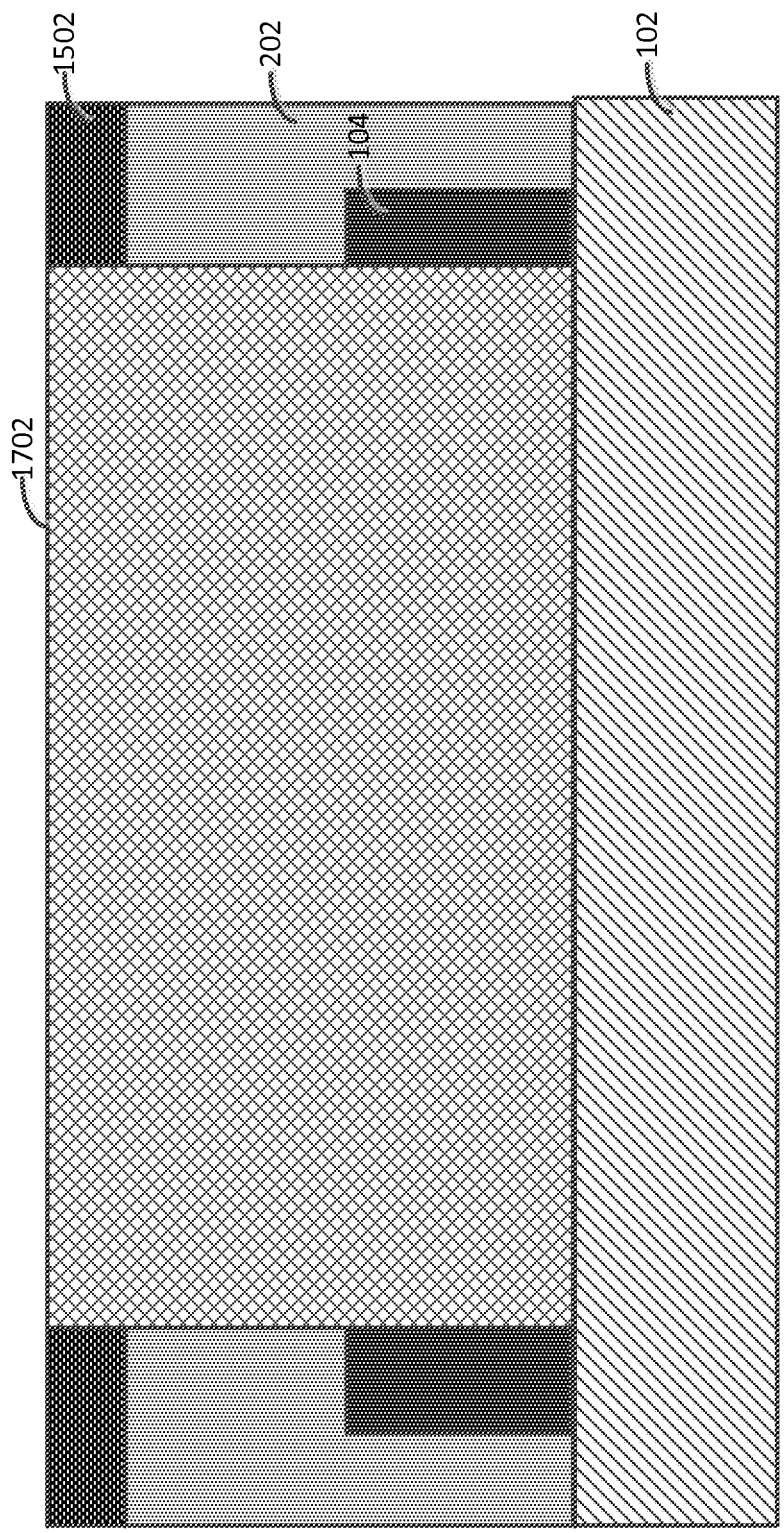

FIG. 17B illustrates a cut away view along the line A-A of FIG. 17A that shows the STI region 1702 and the hardmask layer 1502.

Following the formation of the STI region 1702, the method described above from FIG. 7A to FIG. 13 may be performed as described above to form dummy gate stacks, source/drain regions, and replacement metal gate stacks. The method described above results in finFET devices having strained active regions that sufficiently maintain the strain in the active regions of the devices following the cutting or removing of portions of the fins.

In particular, the fins 104 are cut or etched to remove portions of the fins following the formation of a silicon layer 202 on the fins 104 and prior to the patterning of the dummy gate stacks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor device comprising:
    a first strained semiconductor fin on a strained semiconductor substrate having first and second ends and a fin length therebetween, wherein the first strained semiconductor fin is strained along the fin length;
    a second strained semiconductor fin on the strained semiconductor substrate having first and second ends and a fin length therebetween, wherein the second strained semiconductor fin is strained along the fin length, the second strained semiconductor fin having a longitudinal axis that is substantially collinear with a longitudinal axis of the first strained semiconductor fin;
    a first gate stack arranged over the first strained semiconductor fin, wherein the first gate stack is operative to substantially maintain the strain in the first semiconductor fin, wherein the first gate stack includes a first layer of amorphous silicon, a second layer of amorphous silicon, and a spacer is arranged along sidewalls of the first gate stack, wherein substantially maintaining the strain in the first semiconductor fin includes providing the first amorphous silicon layer on a fin prior to cutting the fin to form the first and second strained semiconductor fins; and a second gate stack arranged over the second strained semiconductor fin, wherein the second gate stack is operative to substantially maintain the strain in the second semiconductor fin, wherein the strained semiconductor substrate defines the first and second strained semiconductor fins.

\* \* \* \* \*